US009867293B1

(12) United States Patent
Fang (10) Patent No.: US 9,867,293 B1
(45) Date of Patent: Jan. 9, 2018

(54) METHOD AND SYSTEM OF CONTROLLING ALLOY COMPOSITION DURING ELECTROPLATING

(71) Applicant: Jerry T. Fang, Palos Verdes Estates, CA (US)

(72) Inventor: Jerry T. Fang, Palos Verdes Estates, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/474,466

(22) Filed: Mar. 30, 2017

(51) Int. Cl.
*H05K 3/18* (2006.01)
*C25D 5/02* (2006.01)
*H05K 3/00* (2006.01)
*C25D 3/62* (2006.01)
*C25D 7/12* (2006.01)
*C25D 17/00* (2006.01)
*C22C 5/02* (2006.01)

(52) U.S. Cl.
CPC ............... *H05K 3/188* (2013.01); *C22C 5/02* (2013.01); *C25D 3/62* (2013.01); *C25D 5/022* (2013.01); *C25D 7/123* (2013.01); *C25D 17/007* (2013.01); *H05K 3/0073* (2013.01); *H05K 2203/0723* (2013.01)

(58) Field of Classification Search
CPC ................................. H05K 3/188; C25D 5/022
See application file for complete search history.

(56) References Cited

U.S. PATENT DOCUMENTS

| 2,834,723 | A | | 5/1958 | Robinson | |
|---|---|---|---|---|---|
| 4,000,045 | A | | 12/1976 | Rotzow | |
| 4,512,854 | A | | 4/1985 | Grah | |
| 2003/0135981 | A1 | * | 7/2003 | Galyean | H01R 12/526 29/597 |
| 2004/0012401 | A1 | * | 1/2004 | King | H05K 3/103 324/754.08 |
| 2004/0231999 | A1 | * | 11/2004 | Morrissey | C25D 3/62 205/247 |
| 2010/0038118 | A1 | * | 2/2010 | Fan | H05K 3/242 174/255 |
| 2016/0174364 | A1 | * | 6/2016 | Harkness, Jr. | H05K 1/111 174/257 |

* cited by examiner

*Primary Examiner* — Bryan D. Ripa
(74) *Attorney, Agent, or Firm* — Tarolli, Sundheim, Covell & Tummino LLP (57) ABSTRACT

A method of controlling alloy composition of deposited gold-tin alloy during electroplating of a large panel includes masking at least one planar surface of the panel with conductive material applied in a predetermined pattern. The masked panel is located at least partially within an electroplating solution including a gold-tin alloy in solution at a predetermined gold:tin ratio. Electrical current applied to the masked panel is conducted across the planar surface via the conductive material to induce a predetermined electrical current distribution across the planar surface and thereby pull gold ions and tin ions from the electroplating solution. The pulled ions are deposited upon a supermajority of an unmasked area of the masked panel. The predetermined pattern is selected to achieve deposition of the gold-tin alloy with substantially uniform alloy composition, directly corresponding to the predetermined gold:tin ratio, across the supermajority of the unmasked area of the masked panel.

13 Claims, 6 Drawing Sheets

METHOD AND SYSTEM OF CONTROLLING ALLOY COMPOSITION DURING ELECTROPLATING

GOVERNMENT SUPPORT

The Government of the United States of America has rights in this invention pursuant to a U.S. Government contract.

TECHNICAL FIELD

This disclosure relates to a method and system of controlling alloy composition during electroplating and, more particularly, to a system and method of controlling alloy composition of deposited gold-tin alloy during electroplating of a large panel.

BACKGROUND

In alloy electroplating, such as gold-tin, on a large panel with multiple smaller boards (e.g., a multi-up circuit board panel or even a large single circuit board), it may be desirable to improve the composition uniformity for eutectic melting point and to increase the productivity by lowering the production costs. Metal and/or metal constituents in the alloy electroplating solution tend to exhibit different deposition rate onto the product. For example, the tin in a gold-tin alloy solution is usually deposited more quickly due to uneven electrical charge across the large panel.

When the alloy is being electrodeposited to facilitate future soldering operations, the melting point of the unevenly deposited alloy will vary from point to point. Any large variation in eutectic melting point of the alloy across the panel will thus create a poor solder joint during later assembly. Often, every part on the panel is un-usable due to the poor quality soldering results achieved when the alloy is deposited in a non-uniform fashion. For other applications, such as nickel-manganese alloy, the mechanical or electrical properties will vary from lot to lot, thus resulting in products with inconsistent performance. Frequently the whole assembly is scrapped after the final testing due to the poor composition uniformity.

For small panels, such as the 6" or smaller diameter round wafers often fabricated for the semiconductor industry, gold-tin electroplating can often be satisfactorily completed. For larger and/or irregularly shaped panels, uneven deposition due to varying electrical fields becomes a problem. Anecdotally, those of ordinary skill in the art of alloy electroplating have expressed a disbelief that gold-tin electroplating with controlled composition of the deposited alloy is possible, using current commercially available technologies, for panels larger than the 6" or smaller diameter round wafers currently being alloy-plated.

SUMMARY

In an embodiment, a method of controlling alloy composition of deposited gold-tin alloy during electroplating of a large panel is described. At least one planar surface of the panel is masked with conductive material applied in a predetermined pattern thereupon to produce a masked panel. The masked panel is located at least partially within an electroplating solution including a gold-tin alloy in solution at a predetermined gold:tin ratio. Electrical current is applied to the masked panel. The electrical current is conducted across the planar surface via the conductive material to induce a predetermined electrical current distribution across the planar surface and thereby pull gold ions and tin ions from the electroplating solution. The pulled gold and tin ions are deposited upon a supermajority of an unmasked area of the masked panel. The predetermined pattern is selected to achieve deposition of the gold-tin alloy with substantially uniform alloy composition, directly corresponding to the predetermined gold:tin ratio, across the supermajority of the unmasked area of the masked panel.

In an embodiment, a system for controlling alloy composition of deposited gold-tin alloy during electroplating of a large masked panel is provided. An electroplating solution includes a gold-tin alloy in solution at a predetermined gold:tin ratio. The electroplating solution selectively surrounds at least a portion of the masked panel. A conductive material is located upon at least one planar surface of the masked panel in a predetermined pattern. A selectively actuable electricity source is electrically connected to the masked panel and to the predetermined pattern. Gold ions and tin ions are pulled from the electroplating solution by electrical current. The pulled gold and tin ions are deposited upon a supermajority of an unmasked area of the masked panel. The predetermined pattern is selected to achieve deposition of the gold-tin alloy with substantially uniform alloy composition, directly corresponding to the predetermined gold:tin ratio, across the supermajority of the unmasked area of the masked panel.

BRIEF DESCRIPTION OF THE DRAWINGS

For a better understanding, reference may be made to the accompanying drawings, in which.

DESCRIPTION OF ASPECTS OF THE DISCLOSURE

This technology comprises, consists of, or consists essentially of the following features, in any combination.

Figure 1:
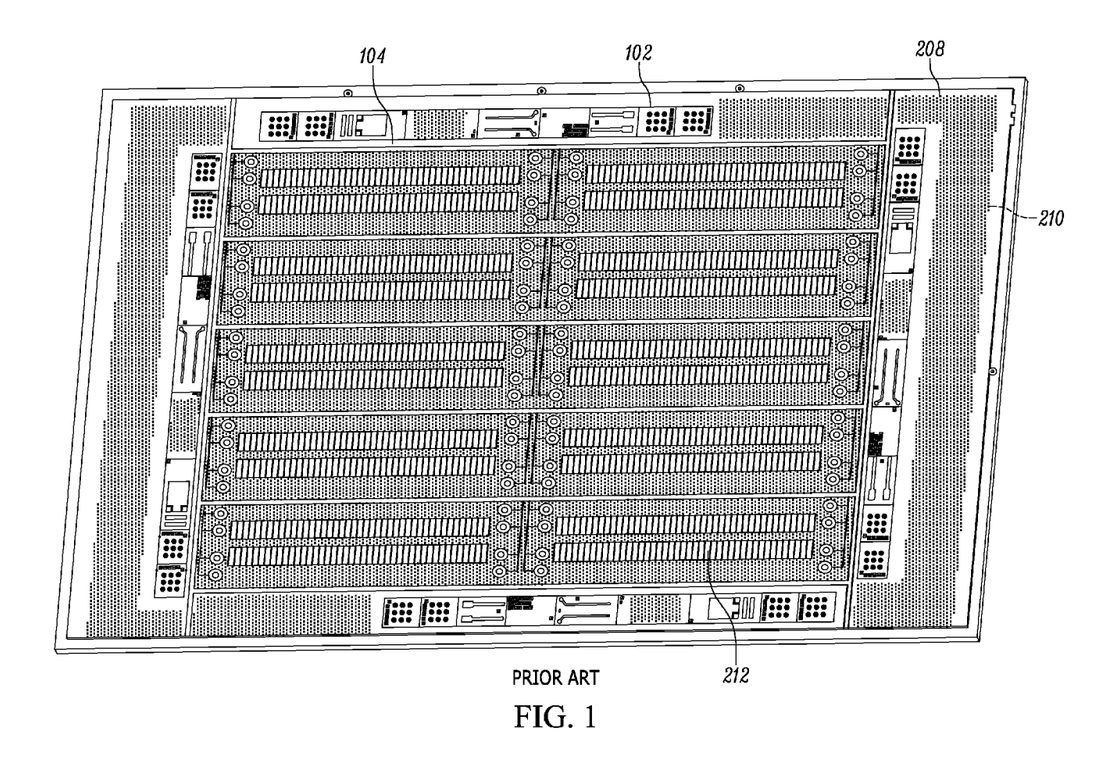
FIG. 1 is a plan view of a panel to be electroplated, according to prior art practices.
Figure 2:
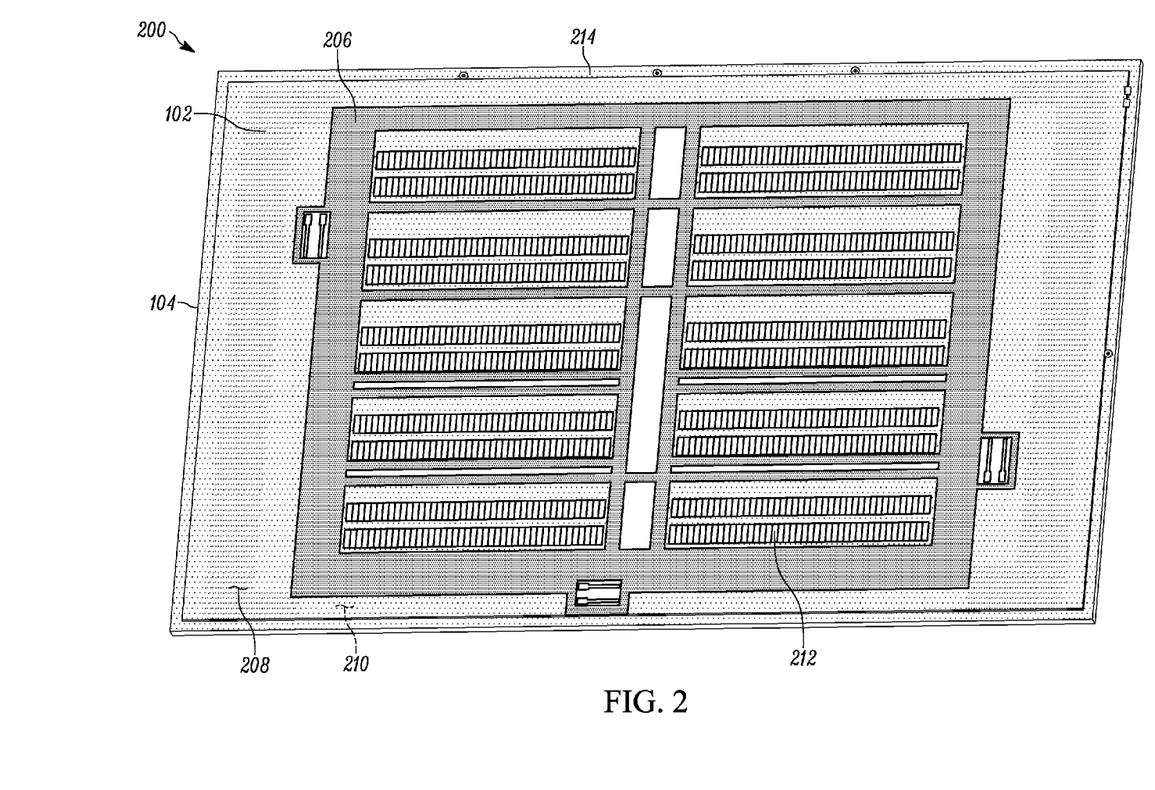
FIG. 2 is a plan view of the panel of FIG. 1, including one aspect of the invention.

An aspect of the disclosure includes a system for controlling alloy composition of deposited gold-tin alloy during electroplating of a large masked panel 200. A "masked panel" 200 (as shown in FIG. 2), as referenced herein, is a circuit board 102 (as shown in FIG. 1) which has had certain circuitry paths etched into a surface thereof (thus, is "patterned"), and tape 104 (e.g., plastic tape) applied to the "unmasked area" portions of the board surface which should not have gold-tin alloy electroplated thereto, thus at least partially blocking/masking those portions of the panel from deposition of gold-tin alloy—this arrangement is shown in FIG. 1 as a prior art circuit board 102, which can be electroplated in a known manner as a first article.

In order to be considered a "masked panel" 200 (A.K.A. a "patterned and partially masked panel") for selective electroplating, however, a conductive material 206 is located upon at least one planar surface of the masked panel 200 in a predetermined pattern. For example, the conductive material 206 could have a width larger than 0.063 inches to level off the high current density ("CD") distribution.

The conductive material 206 could be, for example, metallic tape of any desired type (such as, but not limited to, copper), and can be self-adhesive or adhered to the circuit board 102 in any desired fashion. For example, copper tape could have any suitable various width, and could have a predetermined thickness (e.g., one mil) of plating solution compatible adhesive on a plate-facing/adhering surface thereof. As shown in FIGS. 1-2, the unmasked area (one example of which is indicated by 212) is a portion of the top planar surface 208 which is to be electroplated with gold-tin alloy but which is devoid of tape 104.

Stated differently, the masked panel 200 could include nonconductive material (i.e., the tape 104) in a predetermined nonconductive pattern located on at least one planar surface of the masked panel 200 with at least a portion of the nonconductive material being interposed between, and directly contacting both of, the planar surface of the masked panel 200 and the conductive material 206. In this manner, the tape 104 can be "sandwiched" between the circuit board 102 surface and the conductive material 206.

The masked panel 200—including both tape 104 and conductive material 206—includes oppositely facing top and bottom planar surfaces 208 and 210 (the latter hidden from view in FIG. 2) separated by a board thickness. Each planar surface of the masked panel 200 may have an area of, for example, more than thirty square inches. Gold-tin electroplating of panels having surface areas of less than about thirty square inches (such as, for example, a six-inch diameter round wafer) is currently available commercially, but achieving desired conformity of gold-tin deposition across larger surface areas is believed to be impossible.

The conductive material 206 can be provided to the masked panel 200 after completion of patterned panel manufacturing and before electroplate coating of the masked panel 200—for example, copper tape could be manually applied in the predetermined pattern. The conductive material 206 could also or instead be integrally provided in the predetermined pattern during manufacture of the masked panel 200—for example, copper traces could be etched into the circuit board 102 during manufacture.

Stated differently, at least one planar surface 208 and 210 of the masked panel 200 can be masked by placing a plurality of strips of conductive material 206 in the predetermined pattern on the at least one planar surface 208 and 210 of the masked panel 200. At least two strips of conductive material 206 in the predetermined pattern may intersect and overlap each other in at least one portion of the predetermined pattern—that is, the conductive material 206 could be several layers thick on some portions of the masked panel 200. Tape 104 could be layered atop the conductive material 206, or vice versa, as desired, to change the characteristics of the predetermined pattern (including correction of errors of application of the tape 104 and/or conductive material 206).

A bus bar 214 can be electrically connected to at least one bounding edge (i.e., a perimeter of the planar surface) of the masked panel 200 and to the conductive material 206 in the predetermined pattern, as shown in FIG. 2. It is contemplated that the bus bar 214 could be formed by the masking, or non-masking, of at least a portion of the masked panel 200 as desired, or the bus bar 214 could be separately provided. Electrical connection of the bus bar 214 into the conductive material 206 can assist with transfer of the electrical current from the edge(s) of the masked panel 200 and creating an electrical current distribution connected with the conductive material 206 in the predetermined pattern during the electroplating process.

Figure 3:
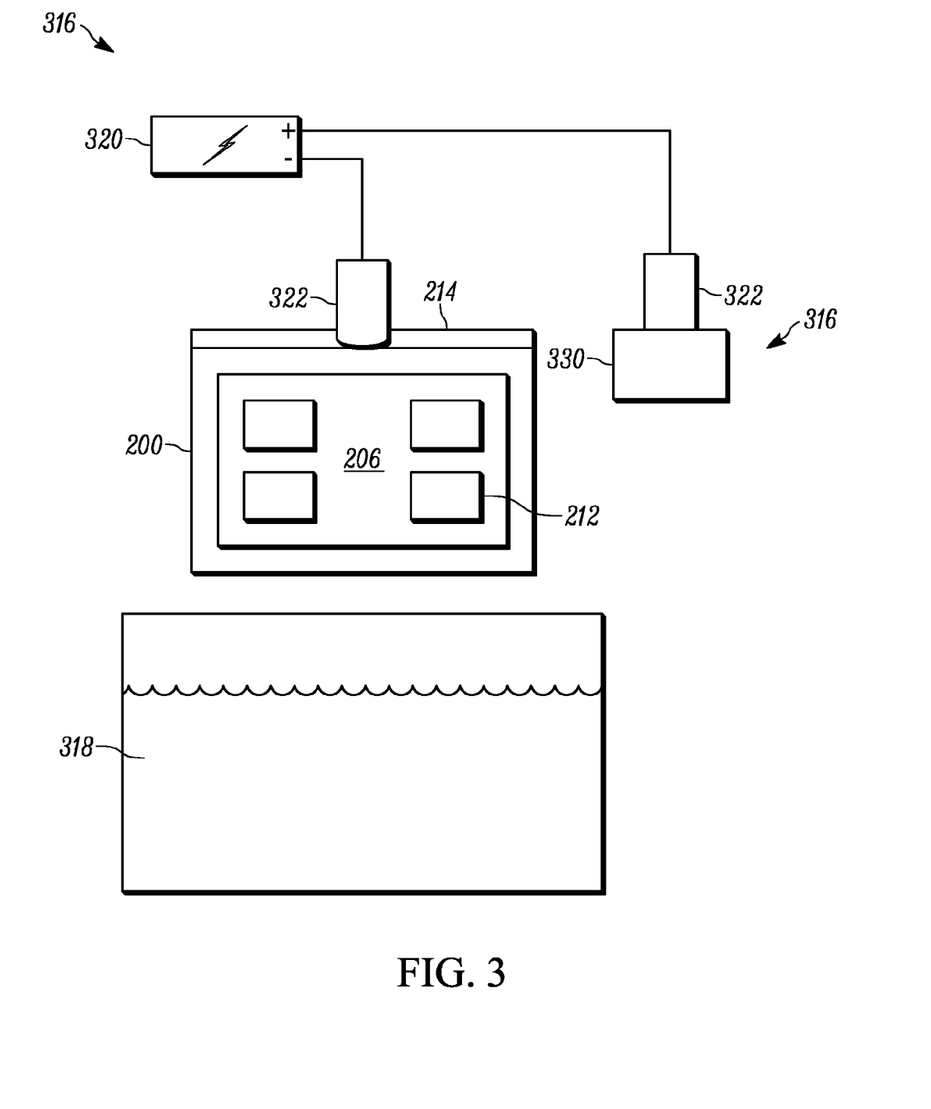
FIG. 3 is a schematic diagram of a system including an aspect of the invention.

With reference to FIG. 3, a system 316 for controlling alloy composition of deposited gold-tin alloy during electroplating of a large masked panel 200 can include an electroplating solution 318 including a gold-tin alloy in fluid solution at a predetermined gold:tin ratio. For example, a suitable electroplating solution 318 could include a mixture of gold compound and tin compound, plus any other additives desired (such as, but not limited to, stabilizers, leveling agents, brighteners, or the like), in solution. For example, certain plating solution suppliers have proprietary electroplating solutions 318 including both the gold-tin alloy in fluid solution at a predetermined gold:tin ratio and some other constituents, which could be used as desired in the system 316.

The masked panel 200 is shown schematically in FIG. 3 as being suspended above the electroplating solution 318. However, during electroplating, the electroplating solution 318 will selectively surround at least a portion of the masked panel 200, optionally symmetrically, such as by the masked panel 200 being at least partially dipped or immersed in the electroplating solution 318. A selectively actuable electricity source 320 is electrically connected to at least one exposed conductor surface of the masked panel 200 to allow electricity to flow to and through the predetermined pattern of conductive material 206 on at least one of the top and bottom planar surfaces 208 and 210 of the masked panel 200, such as, for example, through the use of a bus bar 214 and/or one or more conductive clamps 322, which could be conductive spring clamps, for example. The conductive clamps 322, when present, can be used to conduct both electrical and mechanical force to the masked panel 200, such as by providing a "handle" for dipping the masked panel 200 into the electroplating solution 318.

During electroplating using the system 316, gold ions and tin ions are pulled or generated (e.g., by ionization) from the electroplating solution 318 by electrical current supplied by the electricity source 320, which could be, for example, a direct current ("DC") power supply (rectifier). The pulled gold and tin ions are reduced to their metal form and thus deposited upon a supermajority of an unmasked area 212 of the masked panel 200. The term "supermajority" is used herein to indicate that far more than half of the total unmasked area 212 of the masked panel 200 is electroplated with substantially uniform gold-tin alloy composition, while still admitting of slight irregularities in the composition in very small (much less than half) portions of the total unmasked area 212 of the masked panel 200. (To make the described process cost-effective, the plated areas of the masked panel 200 should be larger than the non-plated, or masked, areas.)

The predetermined pattern of the conductive material 206 may be selected to level off the high CD areas and thereby achieve deposition of the gold-tin alloy with substantially uniform alloy composition, directly corresponding to the predetermined gold:tin ratio, across the supermajority of the unmasked area 212 of the masked panel 200. For example, the substantially uniform alloy composition across the supermajority of the unmasked area 212 of the masked panel 200 may have a ratio of 73-80% gold to 20-27% tin.

It is contemplated that the predetermined gold:tin ratio of the deposited pulled gold and tin ions may be directly correlated with a eutectic melting point of the gold-tin alloy across a supermajority of an unmasked area 212 of the masked panel 200. In such manner, the gold-tin alloy can be deposited with a substantially even or constant composition, to support, for example, the later use of that gold-tin alloy in soldering the masked panel 200 in a uniform and repeatable manner.

Figure 4:
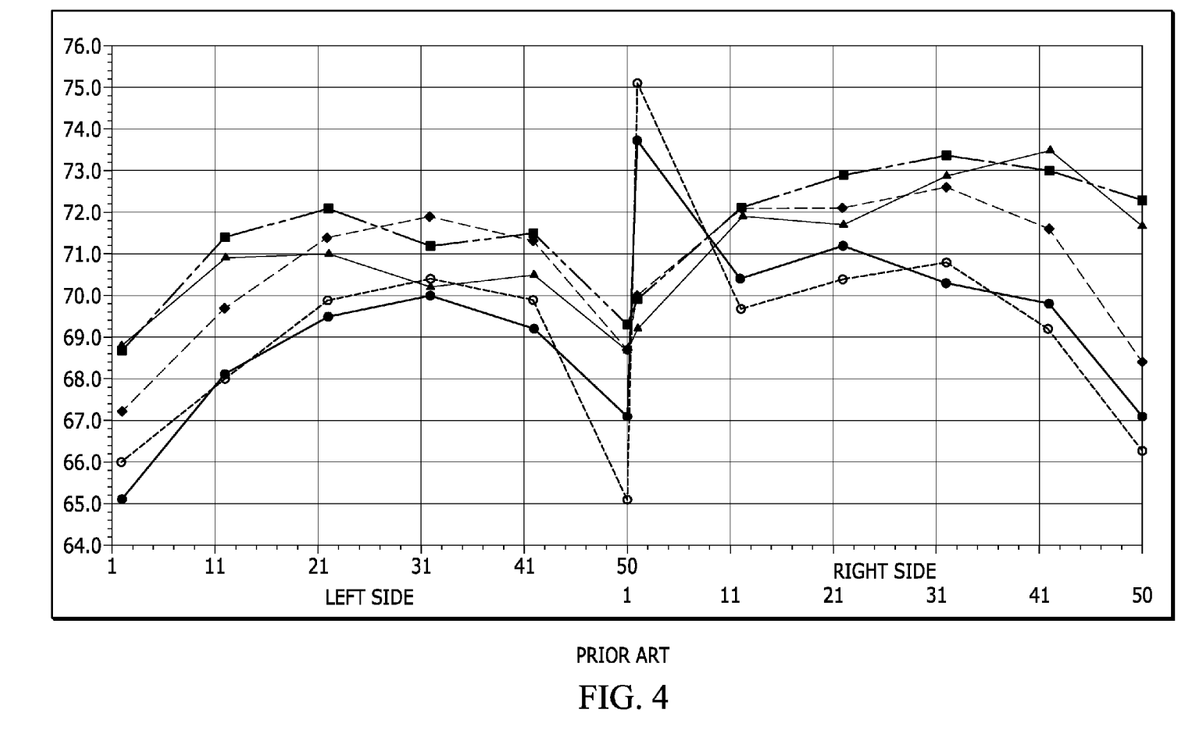
FIG. 4 graphically illustrates a composition analysis of at least a portion of the panel of FIG. 1.

This is in marked contrast to the currently commercially available gold-tin alloy electroplate deposition upon a circuit board 102. For example, and as shown in FIG. 4 (representing the deposition of gold-tin alloy on a circuit board 102 without the use of the predetermined pattern of conductive material 206), the portion of the deposited gold-tin alloy that is comprised of gold varies wildly between about 65-75% across the surface of a single circuit board 102 (electroplated in the unmasked format shown in FIG. 1), with the various gold composition data lines in FIG. 4 being measured (e.g., with a calibrated x-ray fluorescence instrument) at different unmasked areas 212, here shown as pads, of that circuit board 102. (It should be noted that almost all of these values are below the minimum 73% concentration by weight of gold in the original electroplating solution 318.) FIG. 4 illustrates the compositions of gold-tin deposit on the first two rows below the top edge. The two lines on the left show the gold composition on the $1^{st}$, $11^{th}$, $21^{st}$, $31^{st}$, $41^{st}$, and $50^{th}$ pads on the left side of those rows. The lines on the right show the gold composition of the corresponding $1^{st}$, $11^{th}$, $21^{st}$, $31^{st}$, $41^{st}$ and $50^{th}$ pads on the right side. The value is very low in comparison with desired 73 to 80% by weight near the eutectic point of the alloy. This deposition value can be adjusted by using the apparatus and method described and shown herein to bring the gold composition within a desired range.

Figure 5:
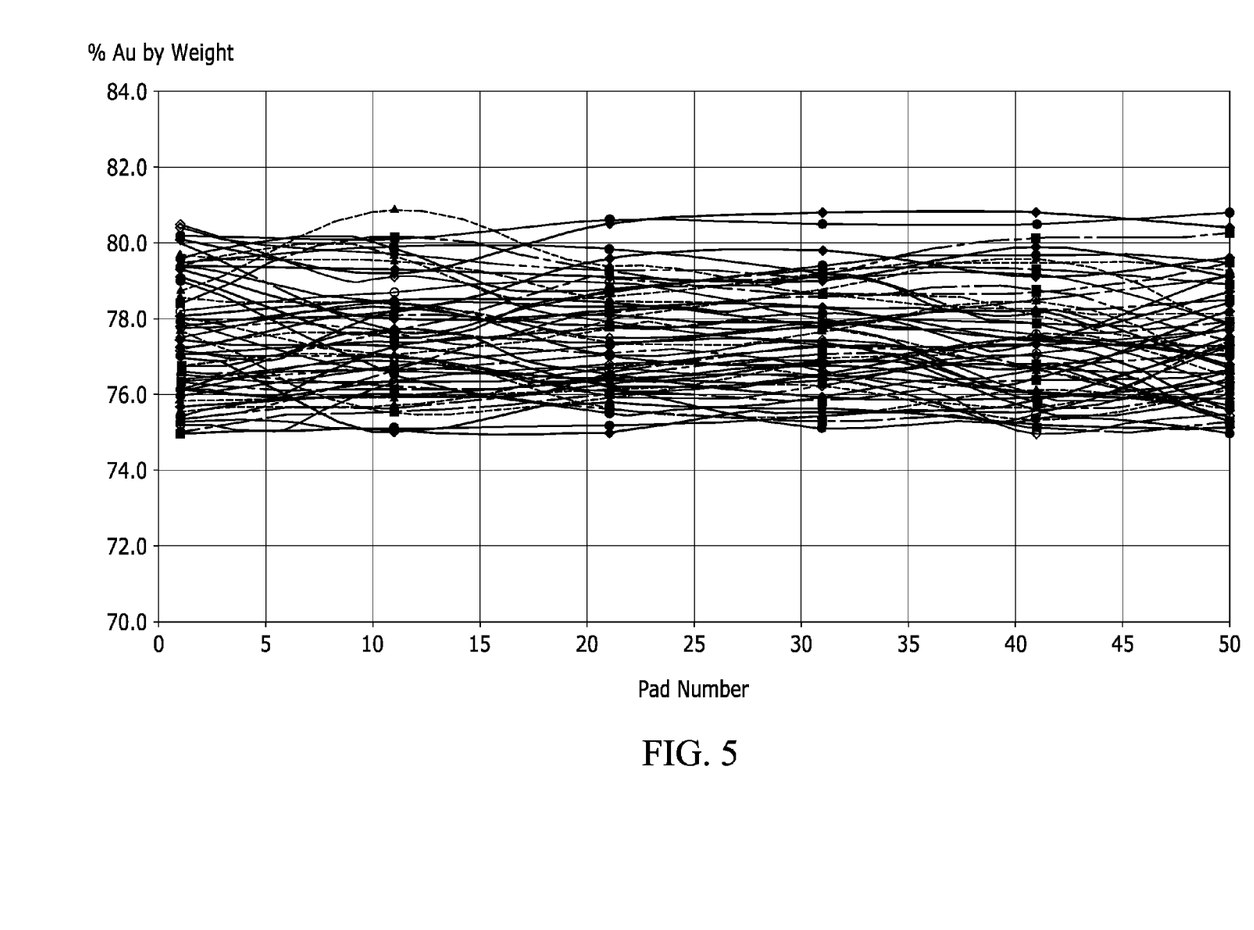
FIG. 5 graphically illustrates a composition analysis of at least a portion of the panel of FIG. 2.

Instead, as shown in FIG. 5, use of the system 316 including the conductive material 206 produces a weight percentage of gold in a very tightly clustered range of between about 74-80% concentration in the deposited gold-tin alloy. For many use applications of the system 316, the pulled/reduced gold and tin ions may be deposited upon a supermajority of the unmasked area 212 of the masked panel 200 in a ratio of 73-80% gold to 20-27% tin.

In order to achieve the desired alloy composition across the planar surface(s) 208 and 210 of the masked panel 200, at least a portion of the predetermined pattern may be placed and/or configured responsive to at least one of:

- a local dimension (e.g., tape width) of the predetermined pattern of the conductive material 206,
- a linear distance between the conductive material 206 and an unmasked area 212 (i.e., a portion of the planar surface 208 and 210 of the masked panel 200 upon which the pulled/generated gold and tin ions are to be deposited on the masked panel 200, when mounted as a cathode in the electroplating system),
- a linear distance between at least one bounding edge (i.e., a perimeter edge of the planar surfaces 208 and 210 of the masked panel 200) and an unmasked area 212 (i.e., a portion of the planar surface 208 and 210 of the masked panel 200 upon which the pulled gold and tin ions are to be deposited), and
- any other factors contributing to the positional and/or electrical relationship among the planar surface(s) 208 and 210, the unmasked area(s) 212, the conductive material 206, the bus bar 214 (when present), the electricity source 320, and the conductive clamps 322.

Figure 6:
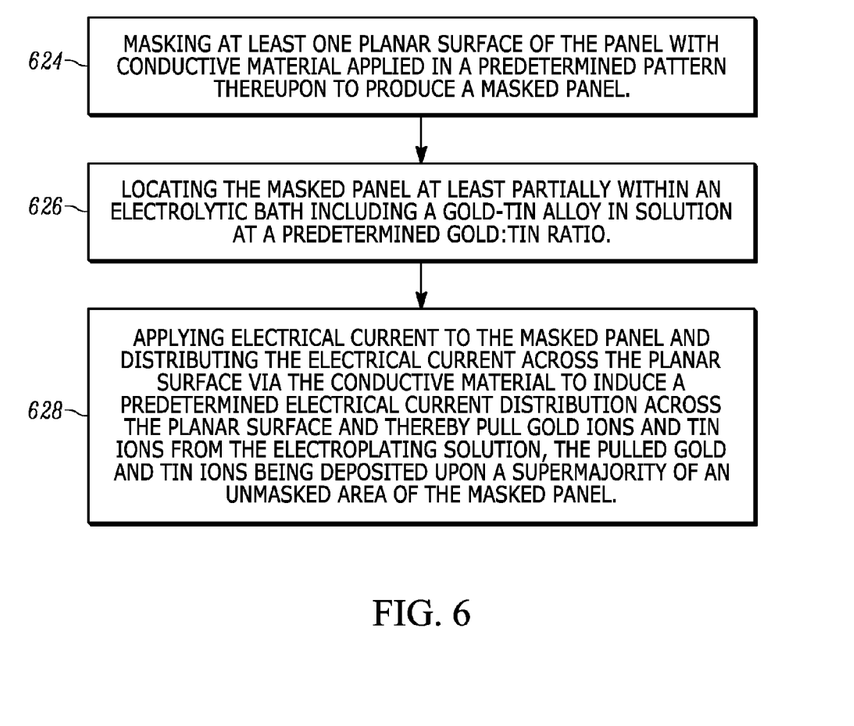
FIG. 6 is a flowchart of a method including an aspect of the invention.

In FIG. 6, a method of controlling alloy composition of deposited gold-tin alloy during electroplating of a large panel is depicted schematically. In first action block 624, at least one planar surface 208 and 210 of a circuit board 102 panel is masked with conductive material 206 applied in a predetermined pattern thereupon to produce a masked panel 200. That is, an unmasked area 212 of the panel can be created by omitting conductive material 206 on portions of the planar surface(s) 208 and 210 of the masked panel 200 upon which the pulled gold and tin ions are to be deposited.

In second action block 626, the masked panel 200 is located (e.g., dipped or immersed, potentially symmetrically) at least partially within an electroplating solution 318 including a gold-tin alloy in solution at a predetermined gold:tin ratio. In third action block 628, electrical current is applied, such as from an electricity source 320, to the masked panel 200 in the electroplating solution 318. The electrical current is distributed across the planar surface(s) 208 and 210 via the conductive material 206 to induce a predetermined electrical current distribution across the planar surface(s) 208 and 210 and thereby generate/reduce/pull gold ions and tin ions from the electroplating solution 318. The reduced gold and tin ions are deposited in metal form upon a supermajority of an unmasked area 212 of the masked panel 200.

The predetermined pattern (of the conductive material 206) may create an active current path, with at least a portion of the conductive material 206, between at least one bounding/perimeter edge of the planar surface(s) 208 and 210 of the masked panel 200 and the unmasked area 212 (i.e., a portion of the planar surface(s) 208 and 210 of the masked panel 210 upon which the pulled/generated gold and tin ions are to be deposited in metal form). For example, at least one bounding/perimeter edge of the masked planar surface(s) 208 and 210 of the masked panel 200 can include a bus bar 214. When a bus bar 214 is present, the active current path can be created with at least a portion of the conductive material 206, between the bus bar 214 and the unmasked area 212 (i.e., a portion of the planar surface(s) 208 and 210 of the masked panel 210 upon which the pulled gold and tin ions are to be deposited).

Regardless of how the electricity is provided to, and conducted across, the masked panel 200, however, the predetermined pattern is selected to achieve deposition of the gold-tin alloy with substantially uniform alloy composition, directly corresponding to the predetermined gold:tin ratio, across the supermajority of the unmasked area 212 of the masked panel 200.

Once the electroplating process has been completed (as signified by the achievement of a predetermined thickness of electrodeposited gold:tin alloy plating), such as by the expiration of a predetermined time period for at least a portion of the masked panel 200 to be held in the electroplating solution 318, the masked panel 200 is removed from the electroplating solution 318. It is contemplated that at least one "coupon" or other sample could be used, as part of the masked panel 210 or provided separately, for testing and/or monitoring the electroplating process, including to help determine when the electroplating process has been completed.

The conductive material 206 and/or the tape 104 can be removed from the planar surface(s) 208 and 210, and any other desired post-processing steps can be completed. The circuit board 102 then will be complete with substantially uniform gold-tin alloy deposition in the (formerly) unmasked areas 212 and bare circuit-board material surrounding the deposited-alloy areas and is ready for additional processing and/or use.

As an example, a suitable electroplating solution 318 for a particular use environment could be prepared, analyzed, and/or adjusted in substantial conformance with the following parameters:

a. Gold metal: 0.40-0.46 troy ounces per gallon
b. Tin metal: 3.5 to 5.0 grams per liter
c. pH: 3.8 to 4.2
d. Temperature: 127-135° F.

The bath circulation rate could be in the range of 2 to 3 turnovers per hour. Mechanical agitation could be applied to the masked panel 200 at any point during the process, including after the masked panel 200 has been placed on the bus bar 214. Mechanical agitation could be particularly useful for two-sided electroplating.

It is contemplated that one or more anodes (shown schematically at 330 in FIG. 3), which could be platinum plated titanium, platinum clad niobium, or any other suitable types, could be provided. When present, the anode(s) 330 can have substantially similar dimensions to the masked panel 200 and/or can be placed on one or both sides of the masked panel 200, such as by being spaced apart at a predetermined distance (e.g., about 6" apart for a 12"×18" masked panel 200) from the masked panel 200. One of ordinary skill in the art can provide a suitable electroplating system for a particular use environment of the masked panel 200.

During preparation (e.g., masking) of the masked panel 200, any desired number of edges (e.g., the three sides which are not associated with a bus bar 214) of the circuit board panel 102 can be provided with tape 104 and/or nonconductive material 206 in any desired pattern. For example, a predetermined pattern (of the conductive material 206) could be applied in an effort to comply with or seek one or more "proximity factors" to achieve the desired coated deposit uniformity of the alloy composition on one or both flat sides of the masked panel 200. One example hierarchy of desirable "proximity factors" is given, in descending order of importance, below:

a. The nominal CD is 4.5 amperes per square foot (ASF) or other value as required to achieve the proper deposit composition and quality.

b. The top edge of the masked panel 200 (as oriented when at least partially surrounded by the electroplating solution 318 has a lower CD than the bottom edge, as long as any provided anode extends at least as deeply into the electroplating solution 318 as the bottom edge of the masked panel 200.

c. The geometric center of any conductor shapes on the masked panel 200 has the lowest CD, and the peripheral edges of any such conductor shape has a higher CD than other areas of the masked panel 200.

d. The conductors closer to the edges of the masked panel 200 have a higher CD than those further from the edges of the masked panel 200.

e. The predetermined pattern of the conductive material 206 on the top and/or bottom planar surface(s) 208, 210 can have at least 0.063 inches gap from the conductors, or any other suitable width spacing (e.g., a value directly corresponding to a router or other tool kerf size) which may help facilitate board depanelization later. A space of a width correlated to a cutting tool head and/or kerf size may help the user to avoid undesirable over-trimming of adjacent boards/board assemblies which are created by cutting up the masked panel 200. The spacing of the predetermined pattern of the conductive material 206 can be used to help modify the composition of the adjacent boards/board assemblies, and also can help to influence the deposit composition of the gold/tin alloy. The degree of influence of one portion of the predetermined pattern of the conductive material 206 on another portion is directly correlated with the distance between the two portions.

It is contemplated that added conductive material 206 could be removed after electroplating to facilitate subsequent manufacturing processes and/or precious metal recycling. One example of a conductive material 206 spacing from conductors or other circuit board panel 102 features could be about 0.5 inches in width for each 7% (by weight) gold composition increase in the electroplating solution 318, with an added gap allowance in the range of one-sixteenth to one-eighth inch, depending at least partially upon the space available on the surface of the masked panel 200 to accept conductive material 206.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

I claim:

1. A method of controlling alloy composition of deposited gold-tin alloy during electroplating of a large panel, the method comprising:
   masking at least one planar surface of the panel with conductive material applied in a predetermined pattern thereupon to produce a masked panel;
   placing nonconductive material in a predetermined nonconductive pattern on at least one planar surface of the masked panel;
   locating the masked panel at least partially within an electroplating solution including gold ions and tin ions, collectively comprising the gold-tin alloy, in solution at a predetermined gold:tin ratio;
   applying electrical current to the masked panel and distributing the electrical current across the planar surface via the conductive material to induce a predetermined electrical current distribution across the planar surface and thereby pull gold ions and tin ions from the electroplating solution, the pulled gold and tin ions being deposited upon a supermajority of an unmasked area of the masked panel, the supermajority of the unmasked area of the masked panel upon which the pulled gold and tin ions are deposited being entirely separated from the conductive material by at least a portion of the nonconductive material in the predetermined nonconductive pattern;

wherein the predetermined pattern is selected to achieve deposition of the gold-tin alloy with substantially uniform alloy composition, directly corresponding to the predetermined gold:tin ratio, across the supermajority of the unmasked area of the masked panel.

2. The method of claim 1, including manufacturing the panel as the masked panel with the conductive material integrally provided in the predetermined pattern.

3. The method of claim 1, wherein the masking at least one planar surface of the panel with conductive material applied in a predetermined pattern thereupon to produce a masked panel includes masking the panel with the conductive material after completion of panel manufacturing and before electroplate coating of the masked panel.

4. The method of claim 1, wherein the pulled gold and tin ions are deposited upon a supermajority of the unmasked area of the masked panel in a ratio of 73-80% gold to 20-27% tin.

5. The method of claim 1, wherein the placing nonconductive material in a predetermined nonconductive pattern on at least one planar surface of the masked panel includes placing nonconductive material in a predetermined nonconductive pattern on at least one planar surface of the masked panel with at least a portion of the nonconductive material being interposed between, and directly contacting both of, the planar surface of the masked panel and the conductive material, the nonconductive material being sandwiched between the planar surface of the masked panel and the overlying conductive material.

6. The method of claim 1, including producing an unmasked area of the masked panel by omitting conductive material on portions of the planar surface of the masked panel upon which the pulled gold and tin ions are to be deposited.

7. The method of claim 1, wherein the predetermined pattern creates an active current path, with at least a portion of the conductive material, between at least one bounding edge of the planar surface of the masked panel and a portion of the planar surface of the masked panel upon which the pulled gold and tin ions are to be deposited.

8. The method of claim 7, wherein the at least one bounding edge of the masked planar surface of the masked panel includes a bus bar, the active current path being created with at least a portion of the conductive material, between the bus bar and a portion of the planar surface of the masked panel upon which the pulled gold and tin ions are to be deposited.

9. The method of claim 1, including selecting at least a portion of the predetermined pattern responsive to at least one of a local dimension of the predetermined pattern of the conductive material, a linear distance between the conductive material and a portion of the planar surface of the masked panel upon which the pulled gold and tin ions are to be deposited, and a linear distance between at least one bounding edge of the planar surface of the masked panel and a portion of the planar surface of the masked panel upon which the pulled gold and tin ions are to be deposited.

10. The method of claim 1, wherein the planar surface of the masked panel has an area of more than thirty square inches.

11. The method of claim 1, wherein the predetermined gold:tin ratio of the deposited pulled gold and tin ions is directly correlated with a eutectic melting point of the gold-tin alloy across a supermajority of an unmasked area of the masked panel.

12. The method of claim 1, wherein the masking at least one planar surface of the panel with conductive material applied in a predetermined pattern thereupon to produce a masked panel includes placing a plurality of strips of conductive tape in the predetermined pattern on at least one planar surface of the panel.

13. The method of claim 12, wherein at least two strips of conductive tape in the predetermined pattern intersect and overlap each other in at least one portion of the predetermined pattern.

\* \* \* \* \*